United States Patent [19]
Roohparvar et al.

[11] Patent Number: 6,094,377
[45] Date of Patent: *Jul. 25, 2000

[54] MEMORY CIRCUIT WITH SWITCH FOR SELECTIVELY CONNECTING AN INPUT/OUTPUT PAD DIRECTLY TO A NONVOLATILE MEMORY CELL

[75] Inventors: Fariborz F. Roohparvar, Cupertino; Michael S. Briner, San Jose, both of Calif.

[73] Assignee: Micron Technology, Inc., Boise, Id.

[*] Notice: This patent is subject to a terminal disclaimer.

[21] Appl. No.: 09/251,034

[22] Filed: Feb. 18, 1999

Related U.S. Application Data

[63] Continuation of application No. 08/989,575, Dec. 12, 1997, Pat. No. 5,896,400, which is a continuation of application No. 08/779,393, Jan. 7, 1997, Pat. No. 5,706,235, which is a continuation of application No. 08/508,848, Jul. 28, 1995, Pat. No. 5,594,694.

[51] Int. Cl.$^7$ ........................................... G11C 7/00
[52] U.S. Cl. .................. 365/189.05; 365/189.06; 365/201
[58] Field of Search ............................. 365/201, 189.06, 365/189.05; 371/21.1

[56] References Cited

U.S. PATENT DOCUMENTS

| | | | |
|---|---|---|---|
| 4,825,414 | 4/1989 | Kawata | 365/201 |
| 4,956,816 | 9/1990 | Atsumi et al. | 365/201 |
| 5,400,281 | 3/1995 | Morigami | 365/201 |
| 5,594,694 | 1/1997 | Roohparvar et al. | 365/201 |

OTHER PUBLICATIONS

"Copy of U.S. Patent Application entitled "Memory System Having Internal State Monitoring circuit," by Frankie F. Roohparvar, filed Jul. 28, 1995 (Attorney Docket No. MCRN–F1200)."

"Copy of U.S. Patent Application Ser. No. 2: 08/386,704, entitled "Apparatus for Entering and Executing Teset Mode Operations for Memory," by Frankie F. Roohparvar, filed Feb. 10, 1995."

*Primary Examiner*—Son T. Dinh
*Attorney, Agent, or Firm*—Schwegman, Lundberg, Woessner & Kluth, P.A.

[57] ABSTRACT

An integrated circuit operable in a test mode and a normal operating mode, which includes an improved test mode switch. In the test mode of preferred embodiments in which the circuit is an integrated memory chip, the test mode switch is closed so as to connect an input/output (I/O) pad directly with a selected memory cell (so a current/voltage characterization of the cell can be obtained). In the normal operating mode of these embodiments, the test mode switch is open and it isolates the I/O pad from direct connection with the selected cell even under the condition that a transistor of the test mode switch undesirably becomes conductive (e.g., due to low voltage on the I/O pad, inductive coupling, or the like). In preferred embodiments, the test mode switch includes a set of series-connected pass transistors and a isolation voltage switch, the pass transistors pass test signals (indicative of test data to be written to or read from a selected cell) directly between the I/O pad and the selected cell in the test mode, and no signals pass through the pass transistors between the I/O pad and any memory cell in the normal mode. In the normal mode of such preferred embodiments, data to be written from the I/O pad to a selected cell passes through an input buffer before reaching the cell (or data to be read from a selected cell passes through an output buffer before reaching the I/O pad), and the isolation voltage switch holds a channel terminal of at least one of the pass transistors at a fixed supply voltage thereby preventing at least one of the pass transistors from undesirably switching on during the normal mode.

18 Claims, 4 Drawing Sheets

6,094,377

MEMORY CIRCUIT WITH SWITCH FOR SELECTIVELY CONNECTING AN INPUT/ OUTPUT PAD DIRECTLY TO A NONVOLATILE MEMORY CELL

This application is a continuation of U.S. Ser. No. 08/989,575 filed Dec. 12, 1997 now U.S. Pat. No. 5,896,400, which is a continuation of U.S. Ser. No. 08/779,393 filed Jan. 7, 1997, issued as U.S. Pat. No. 5,706,235 on Jan. 6, 1998, which is a continuation of U.S. Ser. No. 08/508,848 filed Jul. 28, 1995, issued as U.S. Pat. No. 5,594,694 on Jan. 14, 1997.

BACKGROUND OF THE INVENTION

1. Field of the Invention

The present invention relates to integrated circuits (preferably, integrated nonvolatile memory circuits) that are operable either in a first mode in which input/output (I/O) pads are connected through buffer circuitry to internal circuitry such as an internal logic circuit or an array of memory cells (so that data can be written to the cells through an input buffer, or data can be read from the cells through an output buffer), or in a test mode in which the I/O pads are connected directly to the internal circuitry (such as an internal logic circuit or a memory cell array).

2. Description of Related Art

Nonvolatile memory chips (integrated circuits) with higher density are being introduced to the market each day. In order to achieve higher density, chip manufacturers must continually decrease the size of elements of the chips (such as the size of each cell of a memory array implemented in each chip). With memory array cells having submicron feature sizes, the slightest change in processing of one memory cell relative to another during manufacture results in a big difference in the behavior of the cells with respect to each other.

Many conventional memory chips operate in either a test mode in which input/output ("I/O") pads are connected directly to an array of memory cells, or in a "normal" (or "active") mode in which the I/O pads are connected through buffer circuitry to the array of memory cells. In the latter mode (the "normal" mode) the chip can perform read/write operations in which data is written to selected ones of the cells through an input buffer (or data is read from selected ones of the cells through an output buffer).

FIG. 1 is a simplified block diagram of a conventional memory chip of this type. Integrated circuit 3 of FIG. 1 includes at least one I/O pad 30 (for asserting output data to an external device or receiving input data from an external device), input/output buffer circuit 10 for I/O pad 30, test mode switch M1, address buffers A0 through Ap for receiving memory address bits from an external device, row decoder circuit (X address decoder) 12, column multiplexer circuit (Y multiplexer) 14, and memory array 16 (comprising columns of memory cells, which can be nonvolatile memory cells, such as column 16A). Each of address buffers A0 through Ap includes an address bit pad for receiving (from an external device) a different one of address bit signals X0 through Xn and Y0 through Ym.

I/O buffer circuit 10 includes a "write" branch and a "read" branch." The write branch comprises input buffer 18. The read branch comprises sense amplifier 19 and output buffer 20. In the normal operating mode of chip 3 of FIG. 1, chip 3 executes a write operation by receiving data (to be written to memory array 16) from an external device at I/O pad 30, buffering the data in the write branch, and then writing the data to the appropriate memory cell. Also in this normal operating mode, chip 3 can be controlled to execute a read operation in which it amplifies and buffers data (that has been read from array 16) in the read branch, and then asserts this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Each of the cells (storage locations) of memory array circuit 16 is indexed by a row index (an "X" index determined by decoder circuit 12) and a column index (a "Y" index output determined by circuit 14). FIG. 2 is a simplified schematic diagram of two columns of cells of memory array 16 (with one column, e.g., the column on the right, corresponding to column 16A of FIG. 1). The column on the left side of FIG. 2 comprises "n" memory cells, each cell implemented by one of floating-gate N-channel transistors N1, N3, ..., Nn. The drain of each of transistors N1-Nn is connected to bitline 13, and the gate of each is connected to a different wordline (a different one of wordline 0 through wordline n). The column on the right side of FIG. 2 also comprises "In" memory cells, each cell implemented by one of floating-gate N-channel transistors N2, N4, ..., Nm. The drain of each of transistors N2-Nm is connected to bitline 15, and the gate of each is connected to a different wordline (a different one of wordline 0 through wordline n). The source of each of transistors N1, N3, ..., Nn, and N2, N4, ..., Nm is held at a source potential (which is usually ground potential for the chip during a read or programming operation).

Each memory cell is a nonvolatile memory cell since each of transistors N1, N3, ..., Nn, and N2, N4, ..., Nm has a floating gate capable of semipermanent charge storage. The current drawn by each cell (i.e., by each of transistors N1, N3, Nn, and N2, N4, ..., Nm) depends on the amount of charge stored on the cell's floating gate. Thus, the charge stored on each floating gate determines a data value that is stored "semipermanently" in the corresponding cell. In cases in which each of transistors N1, N3, ..., Nn, N2, N4, ..., and Nm is a flash memory device (as indicated in FIG. 2 by the symbol employed to denote each of transistors N1, N3, ..., Nn, N2, N4, ..., and Nm), the charge stored on the floating gate of each is erasable (and thus the data value stored by each cell is erasable) by appropriately changing the voltage applied to the gate and source (in a well known manner).

In response to address bits Y0–Ym, circuit 14 (of FIG. 1) determines a column address which selects one of the columns of memory cells of array 16 (connecting the bitline of the selected column to Node 1 of FIG. 1), and in response to address bits X0–Xn, circuit 12 (of FIG. 1) determines a row address which selects one cell in the selected column. Consider an example in which the column address selects the column on the right side of FIG. 2 (the column including bitline 15) and the row address selects the cell connected along wordline 0 (the cell comprising transistor N2). To read the data value stored in the selected cell, a signal (a current signal) indicative of such value is provided from the cell's drain (the drain of transistor N2, in the example), through bitline 15 and circuit 14, to node 1 of FIG. 1. To write a data value to the selected cell, a signal indicative of such value is provided to the cell's gate and drain (the gate and drain of transistor N2, in the example).

In the test mode of the FIG. 1 chip, a selected cell of array 16 is connected directly to I/O pad 30 (or directly to several I/O pads including pad 30 and other I/O pads) so that a current/voltage characterization can be performed on the selected cell as follows. The voltage at the cell's drain (the potential at which bitline 15 is held, in the example) is controllable since the selected bitline is directly connected to an external device through I/O pad 30 (thus, the external device can vary the voltage at which bitline 15 is held, in the example). By sweeping the voltage on I/O pad 30 during the test mode and monitoring the resulting current (the current flowing from the selected cell's drain through bitline 15, circuit 14, Node 1, and switch M1 to I/O pad 30), a current/voltage curve for the cell is obtained.

It should be appreciated that in variations on the FIG. 1 circuit (and in alternative embodiments of the invention to be described below), during the test mode, the voltage at the gate of the selected cell (in addition to or instead of the voltage at the cell's drain) is controlled (e.g., via direct connection of the gate through access to the wordline driver supply through a pad). In the test mode of each such variation (and of each embodiment of the invention), the voltage on the selected I/O pad is swept (to vary the voltage at the selected cell's drain), and the current at the selected I/O pad is monitored to obtain a current/voltage curve for the cell. Then, voltage of the gate of the selected cell is changed and by sweeping the voltage on the I/O pad and monitoring the current at the selected I/O pad another current/voltage curve for the cell is obtained. When this process is repeated for each of a sequence of gate voltages, a family of current/voltage curves for the cell is determined.

With reference again to FIG. 1, the function of switch M1 is to switch the FIG. 1 chip between its a test mode and its normal operating mode. Conventionally, switch M1 is an NMOS transistor whose gate receives a control signal ("Test Mode Enable") from internal control logic of the chip. The source and drain of M1 are connected in series with I/O pad 30 and circuit 14. Switch M1 operates as follows in response to the control signal:

M1 is "on" when Test Mode Enable is high (when the value of Test Mode Enable triggers the "test" mode of FIG. 1), and thus M1 functions as a pass transistor which passes a signal (a "test" signal) indicative of test data to be written to or read from a selected cell of array 16 (e.g., a current signal indicative of test data read from the selected cell) between its source and drain (and thus between I/O pad 30 and the selected cell of array 16) without passing such data signal through buffer 10; and M1 is "off" when Test Mode Enable is low (when the value of Test Mode Enable triggers the "normal" operating mode of FIG. 1), so that signals (indicative of data to be written to memory array 16) provided from an external device to I/O pad 30 are buffered in input buffer 18 and then asserted to memory array 16, or signals (indicative of data read from memory array 16) are asserted from memory array 16 to sense amplifier 19, amplified in amplifier circuit 19, and then buffered in output buffer 20 and asserted to I/O pad 30. Typically, the "low" value of Test Mode Enable is ground potential.

In the normal operating mode of FIG. 1 (with M1 "off"), the FIG. 1 circuit executes a write operation as follows. Each of address buffers A0 through An asserts one of bits X0–Xn to decoder circuit 12, and each of address buffers An+1 through Ap asserts one of bits Y0–Ym to circuit 14. In response to these address bits, circuit 14 determines a column address (which selects one of the columns of memory cells of array 16, such as column 16A), and circuit 12 determines a row address (which selects one cell in the selected column). In response to a write command (supplied from control circuitry not shown in FIG. 1), a signal (indicative of data) present at the output of input buffer 18 (which has been enabled by the appropriate level of the control signal "DATA DRIVER ON") is asserted through circuit 14 to the cell of array 16 determined by the row and column address (e.g., to the drain of such cell). During such write operation, output buffer 20 is disabled (in response to an appropriate level of control signal OUTPUT ENABLE).

A data latch (not shown) is typically provided between input buffer 18 and I/O pad 30 for storing data (to be written to a memory cell) received from I/O pad 30. When the latched data is sent to input buffer 18, input buffer 18 produces a voltage at Node 1 which is applied to the selected memory cell. Input buffer 18 is typically implemented as a tri-statable driver having an output which can be placed in a high impedance mode (and thus disabled) during a read operation. Input buffer 18 is disabled by asserting (to input buffer 18) an appropriate level of the control signal DATA DRIVER ON. In some implementations, the functions of the latch and input buffer 18 are combined into a single device.

In the normal operating mode (with M1 "off"), the FIG. 1 circuit executes a read operation as follows. Each of address buffers A0 through An asserts one of bits X0–Xn to address decoder circuit 12, and each of address buffers An+1 through Ap asserts one of bits Y0–Ym to circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command (supplied from control circuitry not shown in FIG. 1), a current signal indicative of a data value stored in the cell of array 16 (a "data signal") determined by the row and column address is supplied from the drain of the selected cell through the bitline of the selected cell and then through circuit 14 to sense amplifier 19. This data signal is amplified in amplifier 19, buffered in output buffer 20 (which is enabled by an appropriate level of control signal "OUTPUT ENABLE"), and finally asserted at I/O pad 30. During such read operation, input buffer 18 is disabled (in response to an appropriate level of control signal DATA DRIVER ON).

When reading a selected cell of array 16, if the cell is in an erased state, the cell will conduct a first current which is converted to a first voltage in sense amplifier 19. If the cell is in a programmed state, it will conduct a second current which is converted to a second voltage in sense amplifier 19. Sense amplifier 19 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier 19 sends to output buffer 20, which in turn asserts a corresponding data signal to I/O pad 30 (from which it can be accessed by an external device).

During the test mode, input buffer 18, sense amplifier 19, and output buffer 20 are all disabled (in response to appropriate levels of their respective control signals DATA DRIVER ON, SENSE AMPLIFIER ENABLE, and OUTPUT ENABLE).

During a write operation in the normal operating mode, control signal SENSE AMPLIFIER ENABLE disables sense amplifier 19. During a read operation in the normal operating mode, circuit 14 is employed to access the desired cell in array 16 and control signal SENSE AMPLIFIER ENABLE enables sense amplifier 19 so that sense amplifier 19 can determine the state of the selected cell as described.

It is important during a write operation (in the normal operating mode) to provide the wordline of the selected cell with the proper voltage and the drain of the selected cell with the appropriate voltage level (the voltage determined by the output of input buffer 18), in order to successfully write data to the cell without damaging the cell.

However, two serious problems often arise during the normal operating mode of conventional memory chip 3 of FIG. 1. These problems will next be described with reference to FIG. 3. When conventional I/O buffer 10 executes a "write" operation (during the normal operating mode), it is desired that conventional switch M1 (an NMOS transistor) is "off" and thus the gate of switch M1 is grounded as shown in FIG. 3 (ground voltage is the "low" level of Test Mode Enable applied to M1's gate). However, even with the gate of switch M1 grounded, switch M1 may undesirably turn "on" if the voltage at I/O pad 30 falls sufficiently low (e.g., to −1 volt, where M1 has a threshold voltage $V_{th}$ equal to about 0.5 volt) during the normal operating mode (e.g., during a write operation in the normal operating mode). If switch M1 undesirably turns "on" at this time, the voltage (at Node 1) applied to the selected memory cell is undesirably affected by the voltage at I/O pad 30. For example, with switch M1 undesirably "on" during a write operation in the normal operation mode, even if the output of buffer 18 (which is suppose to have a high value, such as five or six volts, in response to a low voltage at I/O pad 30, such as −1 volt), switch M1 (configured as a pass transistor) will undesirably pull Node 1 down and load down the driver of buffer 18. This will change the level of the voltage on the drain of the selected memory cell. This effect can cause a failure of the programming of the selected memory cell.

A second problem can arise when the circuit of FIG. 1 (and FIG. 3) executes a read operation in the normal operation mode. When a programmed bit is read from a selected memory cell, the selected column of cells (and thus Node 1) will go to a voltage higher than sense amplifier 19's trip point, with the result that the output voltage at I/O pad 30 (the data value read from the selected cell) goes from high to low. If however, switch M1 undesirably turns "on" due to inductive coupling of I/O pad 30 to a negative value (or the like) during such read operation, M1 will pull Node 1 down to a voltage lower than sense amplifier 19's trip point, with the result that the output voltage at I/O pad 30 goes from low to high. This effect causes a voltage oscillation at I/O pad 30, which can cause an incorrect data value to be read from the selected memory cell.

The present invention provides a test mode switch that is not subject to the problems described in the two previous paragraphs.

SUMMARY OF THE INVENTION

The invention is an integrated circuit operable in a test mode and a normal operating mode, which includes an improved test mode switch. In preferred embodiments, the integrated circuit is an integrated memory circuit. In some such preferred embodiments, each memory cell of the integrated memory circuit is a nonvolatile memory cell such as a flash memory cell.

In the test mode of an integrated memory circuit embodying the invention, the test mode switch is in a "closed" (conductive) state in which it connects an I/O pad of the chip directly with a selected memory cell (so that a test can be performed to obtain a current/voltage characterization of the cell). In the normal operating mode of such memory circuit, the test mode switch is in an "open" (non-conductive) state in which it isolates the I/O pad from direct connection with the selected memory cell, even under the condition that a transistor of the test mode switch undesirably becomes conductive (for example due to low voltage on the I/O pad, inductive coupling, or the like). A control signal (denoted herein as "Test Mode Enable") applied to the test mode switch determines whether the test mode switch is in the closed or open state.

In a class of preferred embodiments, the test mode switch includes a set of series-connected pass transistors and a isolation voltage switch. In the test mode, the pass transistors pass test signals directly between the I/O pad and selected internal circuitry of the chip (so that the test signals are not processed in buffer circuitry). In preferred embodiments in which the chip is a memory chip, the internal circuitry is a selected memory cell and the test signals are indicative of test data to be written to or read from the memory cell. In the normal mode, no signals pass through the pass transistors between the I/O pad and the selected internal circuitry. Rather, during the normal mode, signals to be passed from the I/O pad to the selected 1internal circuitry (e.g., signals indicative of test data to be written to a memory cell) pass through an input buffer before reaching the selected internal circuitry, and signals to be passed from the selected internal circuitry to the I/O pad (e.g., data read from a memory cell) pass through an output buffer before reaching the I/O pad. In the normal mode, the isolation voltage switch holds a channel terminal of at least one of the pass transistors at a fixed supply voltage, thereby preventing at least one of the pass transistors from undesirably switching on during the normal mode.

In one preferred embodiment, channel terminals of two of the pass transistors are connected together at a Node, and the isolation voltage switch includes an inverter and an NMOS transistor whose gate receives an inverted Test Mode Enable signal and whose source and drain are connected between the fixed supply voltage and the Node. In another preferred embodiment, channel terminals of two of the pass transistors are connected together at a Node, and the isolation voltage switch is a PMOS transistor whose gate receives the Test Mode Enable signal and whose source and drain are connected between the fixed supply voltage and the Node.

DETAILED DESCRIPTION OF THE INVENTION

Figure 4:
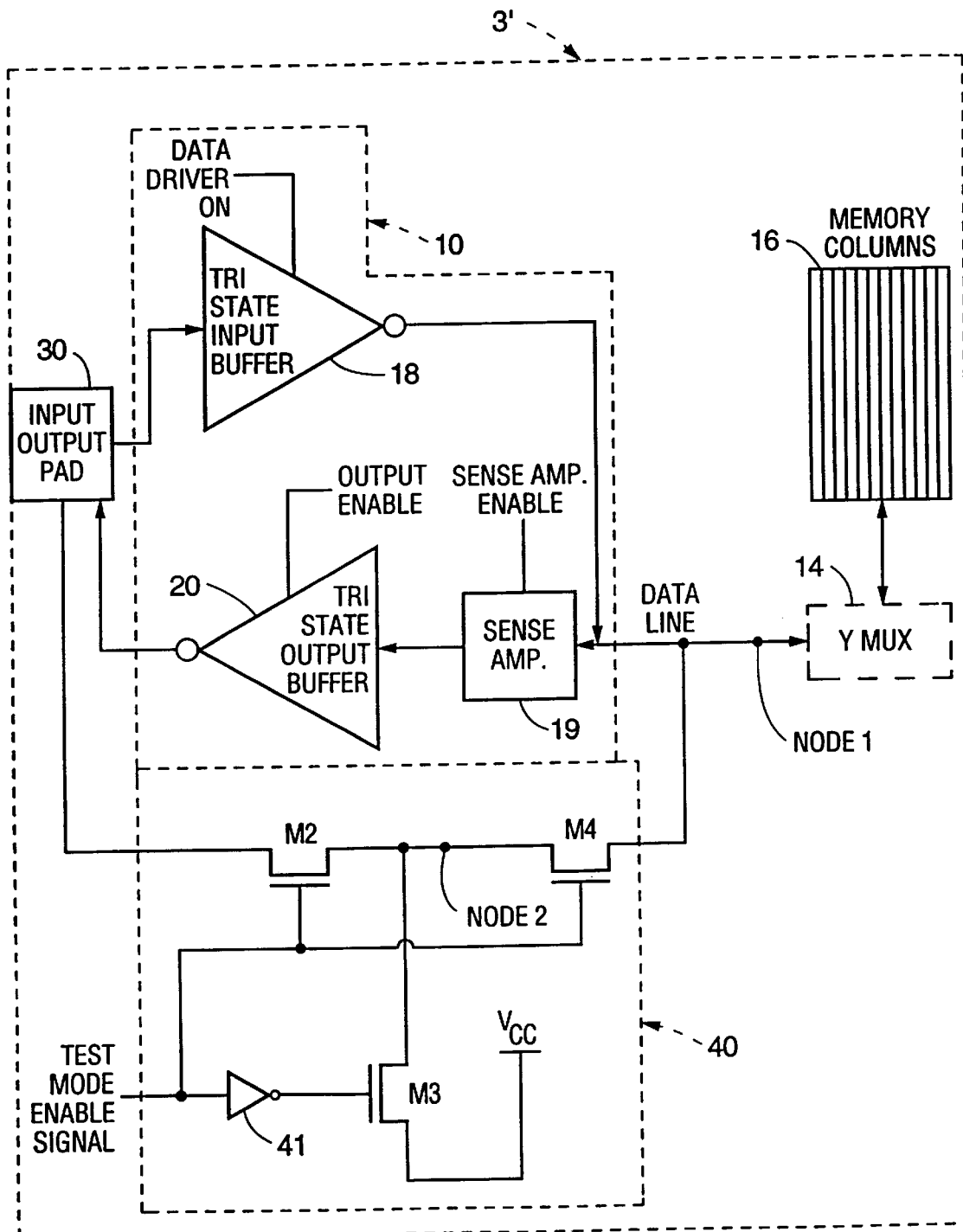
FIG. 4 is a schematic diagram of a variation on FIG. 3 in which a first embodiment of a test mode switch according to the present invention is provided as a substitute for conventional test mode switch M1 of FIG. 3.

We will describe a first embodiment of the invention with reference to FIG. 4. This embodiment is a memory chip (identified by reference numeral 3') which includes an embodiment of the inventive test mode switch (circuit 40, which comprises NMOS transistors M2, M3, and M4 and inverter 41) as a substitute for conventional test mode switch M1 of FIG. 1.

Figure 1:
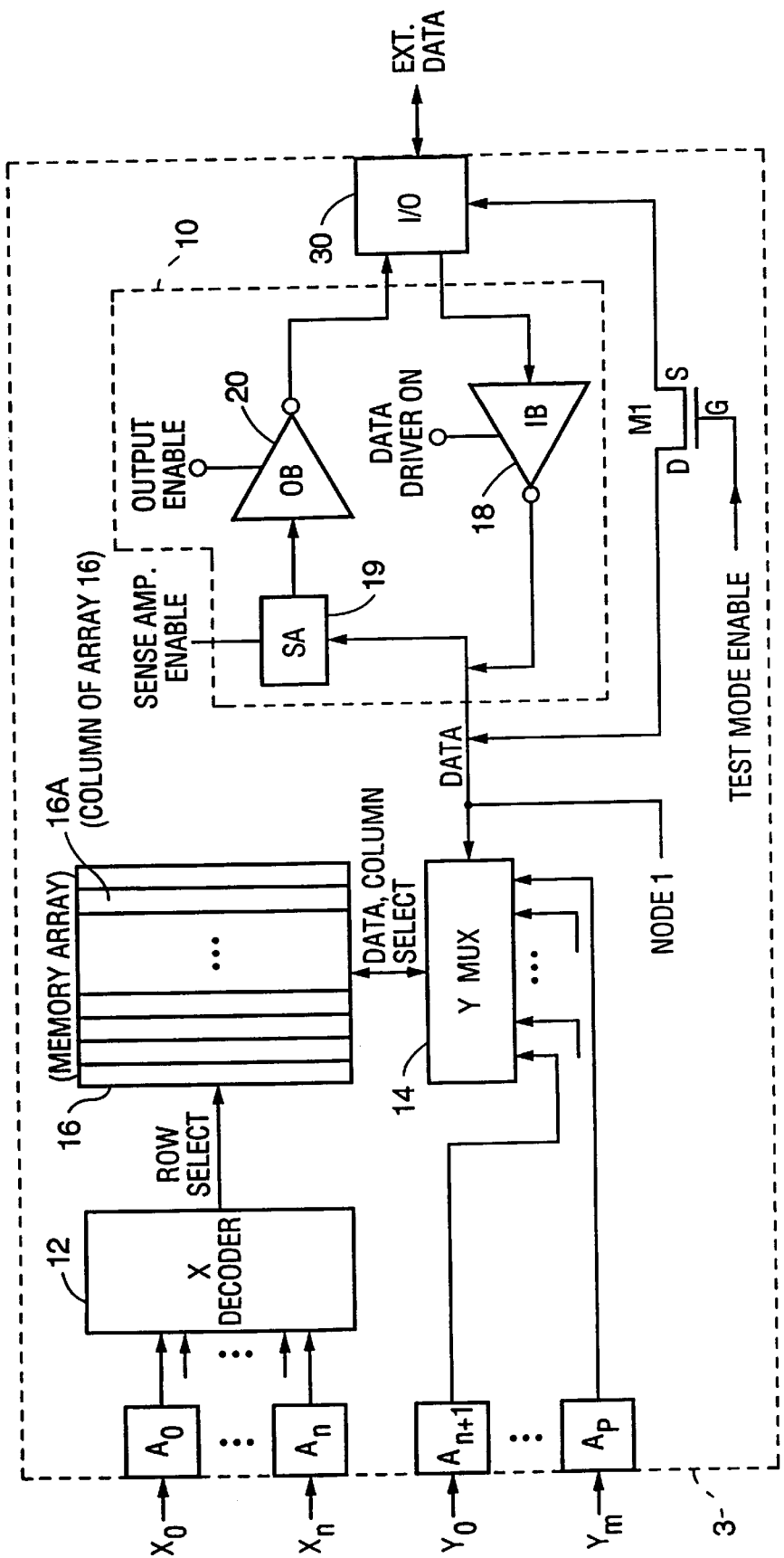
FIG. 1 is block diagram of a conventional memory circuit (implemented as an integrated circuit), including a conventional I/O buffer circuit 10 and a conventional test mode switch M1.
Figure 2:
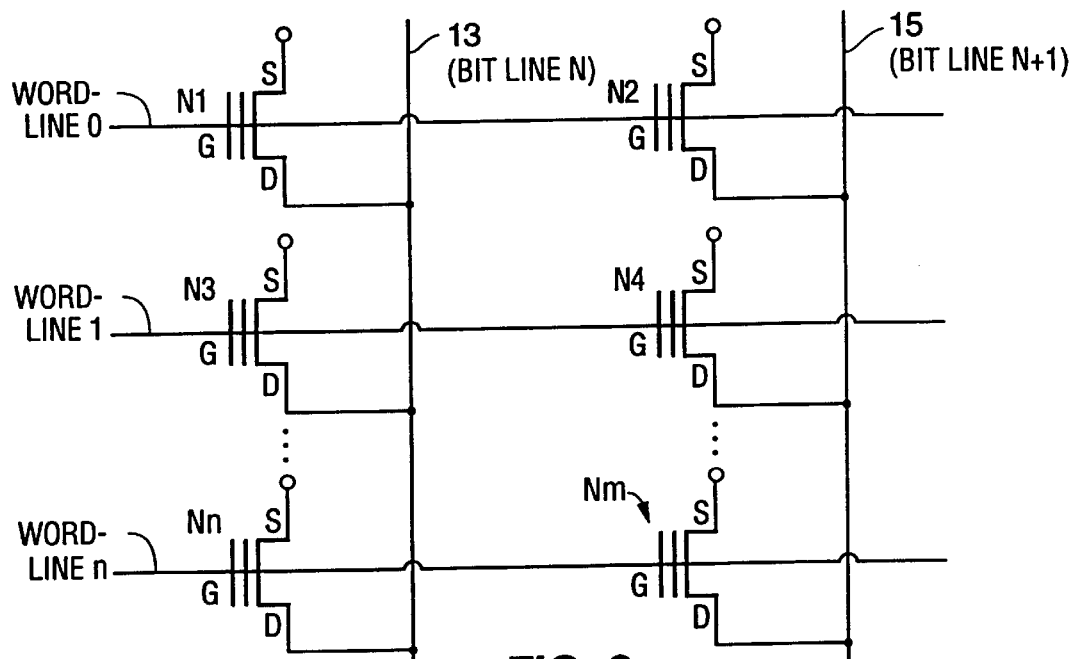
FIG. 2 is a simplified schematic diagram of two columns of memory cells of memory array 16 of FIG. 1.

Memory chip 3' of FIG. 4 is identical to conventional memory chip 3 of FIG. 1 except in that chip 3' includes test mode switch 40 (which embodies the invention) rather than conventional test mode switch M1. Only test mode switch 40 of chip 3' will be described below, since the foregoing description of those elements of chip 3 other than test mode switch M1 applies equally well to chip 3', and no purpose would be served by repeating it below. It is contemplated that in preferred embodiments of the inventive memory chip, each memory cell in each memory array of the chip is a nonvolatile memory cell (preferably a flash memory cell).

With reference to FIG. 4, test mode switch 40 has the following structure. The input of inverter 41 receives control signal "Test Mode Enable" from internal circuitry of the chip, and the gate of NMOS transistor M3 receives the output of inverter 41 (the inverse of Test Mode Enable). The drain of M3 is connected to supply voltage $V_{CC}$, and the source of M3 is connected to Node 2. NMOS transistors M2 and M4 are both connected as pass transistors, with the gate of each receiving control signal Test Mode Enable. The source and drain terminals of each of M2 and M4 will be referred to collectively as "channel" terminals. One channel terminal of M2 is connected to one channel terminal of M4 (at Node 2), the other channel terminal of M2 is connected to I/O pad 30, and the other channel terminal of M4 is connected to Node 1. Node 1 is connected through multiplexer circuit 14 to the selected memory cell.

Test mode switch 40 operates as follows in response to control signal Test Mode Enable:

when Test Mode Enable is high (when the value of Test Mode Enable triggers the "test" mode of FIG. 4), M2 and M4 are "on" and M3 is "off." Thus, switch 40 is in a "closed" (conductive) state in which M2 and M4 function as pass transistors which pass a signal (a "test" signal) indicative of test data to be written to or read from a selected cell of array 16 (e.g., a current signal indicative of test data read from the selected cell). The test signal passes through the channel terminals of M2 and M4 (and thus between I/O pad 30 and the selected cell of array 16) without passing through buffer 10; and when Test Mode Enable is low (when the value of Test Mode Enable triggers the "normal" operating mode of FIG. 4), M2 and M4 are "off" and M3 is "on." Thus, switch 40 is in an "open" (non-conductive) state in which signals (indicative of data to be written to memory array 16) provided from an external device to I/O pad 30 are buffered in input buffer 18 and then asserted to memory array 16, or signals (indicative of data read from memory array 16) are asserted from memory array 16 to sense amplifier 19, amplified in amplifier circuit 19, and then buffered in output buffer 20 and asserted to I/O pad 30. Typically, the "low" value of Test Mode Enable is ground potential.

When the FIG. 4 circuit executes a write operation during the normal operating mode of FIG. 4, with Test Mode Enable "low" (grounded), M3 "on," and M2 and M4 "off" (i.e., with the gates of M2 and M4 grounded), if the voltage on I/O pad 30 falls sufficiently low (e.g., to −1 volt, where both M2 and M4 have a threshold voltage $V_{th}$ approximately equal to 0.5 volt), M2 can turn "on." This can occur frequently where the memory array is an array of nonvolatile memory cells, since typical specifications for nonvolatile memory chips contemplate that I/O pad voltage can fall sufficiently low to turn on a transistor such as M2.

During the normal operating mode of FIG. 4, Node 2 is held at $V_{CC}$–$V_T$ through transistor M3. If I/O pad 30 is brought down to −1 volt externally, M2 will tend to turn on. Once that happens, both transistors M3 and M2 are on and there is a current path between $V_{CC}$ and I/O pad 30. M3 will try to pull I/O pad 30 up to the point where M2 turns off (e.g., −0.5 volt in this example) and I/O pad 30 will try to pull down Node 2 to −1 volt. The voltage level of Node 2 will be somewhere between ($V_{CC}$–$V_T$) and −1 volt, at a specific value determined by the relative current driving strengths of M2 and M3. If M3's current driving capability is larger than M2's, then Node 2 will end up closer to ($V_{CC}$–$V_T$) than to −1 volt. If M2's current driving capability is larger than M3's, then Node 2 will end up closer to −1 volt than to ($V_{CC}$–$V_T$)

The strength of each of the two transistors M2 and M3 is proportional to its width/length ratio (W/L) and the value of $(V_{GS}-V_T)^2$ applied to it, since these transistors operate in saturation mode. Transistor M2 needs to be sized to have sufficient strength for transferring the applied voltage and current when the test mode enable signal is active. However, during the normal operating mode, if I/O pad 30 goes to −1 volt, the ($V_{GS}$–$V_T$) of M2 is very small and $(V_{GS}-V_T)^2$ is even smaller. On the other hand, M3 has a "high" voltage (e.g., 5 volts) on its gate, and as Node 2 is pulled down through M2, $V_{GS}$ of M3 will increase and so will its strength. Although it is conceivable that sizes for M2 and M3 could be chosen which would cause switch 40 to operate with low efficiency, one would need to try very hard in order to determine such sizes. This is true because the only circumstance under which switch 40 would not work properly is for Node 2 to be pulled down so low that M4 also turns on (assuming M2 has turned on). Since the gate of M4 is at ground (0 volts), Node 2 would need to come down to a VT below ground (e.g., 0.5 volts in the example) for that to occur. As described previously, for this to happen, $(V_{GS}-V_T)^2$ of M2 is 0.25 and $(V_{GS}-V_T)^2$ of M3 is about 20. So, unless the W/L of M2 is on the order of 100 times greater than the W/L of M3, this situation would not happen since the current $I_D$ of each of M2 and M4 is proportional to (W/L) $(V_{GS}-V_T)^2$. Therefore, as mentioned previously, it would be necessary to skew the sizes of M2 and M3 radically to design a specific implementation of switch 40 that would not function properly.

With a properly functioning implementation of switch 40, in the normal operation mode, even if M2 turns on, it would not be able to pull Node 2 down sufficiently to turn M4 on. Thus, Node 1 will remain undisturbed by a voltage at I/O pad 30 which causes M2 to turn on.

In this way, circuit 40 prevents an incorrect data value from being written from input buffer 18 to the selected memory cell even if M2 undesirably turns on in response to a low voltage on I/O pad 30 during a write operation in the normal operating mode.

Circuit 40 also prevents an incorrect data value from being read from a selected memory cell even if M2 undesirably turns on in response to a sufficiently low voltage on I/O pad 30 during a read operation in the normal operating mode. The explanation for this is as follows. When circuit 3' reads a programmed bit from a selected memory cell, the bitline of the selected column of cells (and thus Node 1) goes to a voltage higher than sense amplifier 19's trip point, with the result that the output voltage at I/O pad 30 (the data value read from the selected cell) goes from high to low. I/O pad 30 might go to a negative voltage due to inductive coupling. For the reason explained above, switch 40 will not allow Node 2 to go sufficiently low to turn M4 on even if M2 is turned on. This decouples Node 1 from pad 30, and hence the noise is not fed back from pad 30 to Node 1 during a read operation. Thus, the output voltage provided from output buffer 20 to I/O pad 30 remains unaffected by the transition of M2 from off to on (since M4 remains off).

Figure 3:
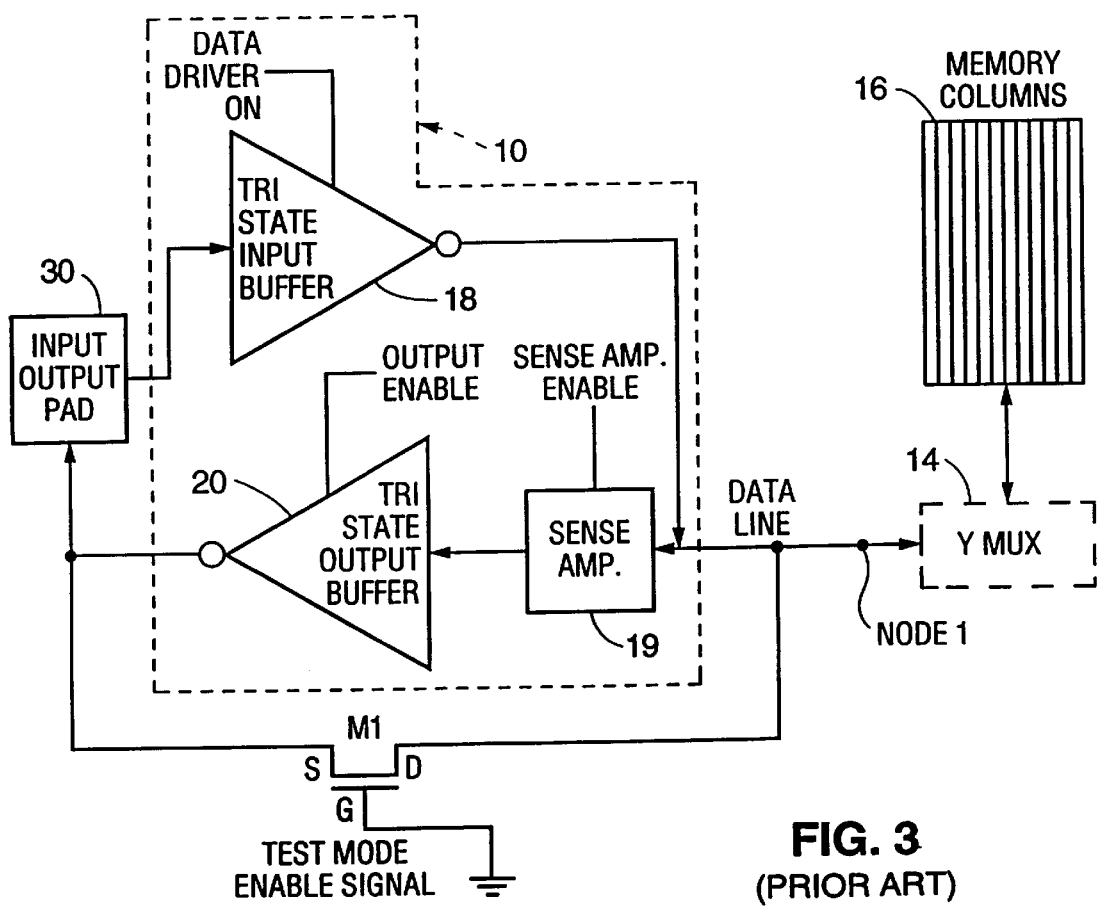
FIG. 3 is an enlarged diagram of a portion of the circuitry shown in FIG. 1 (in the normal operating mode).
Figure 5:
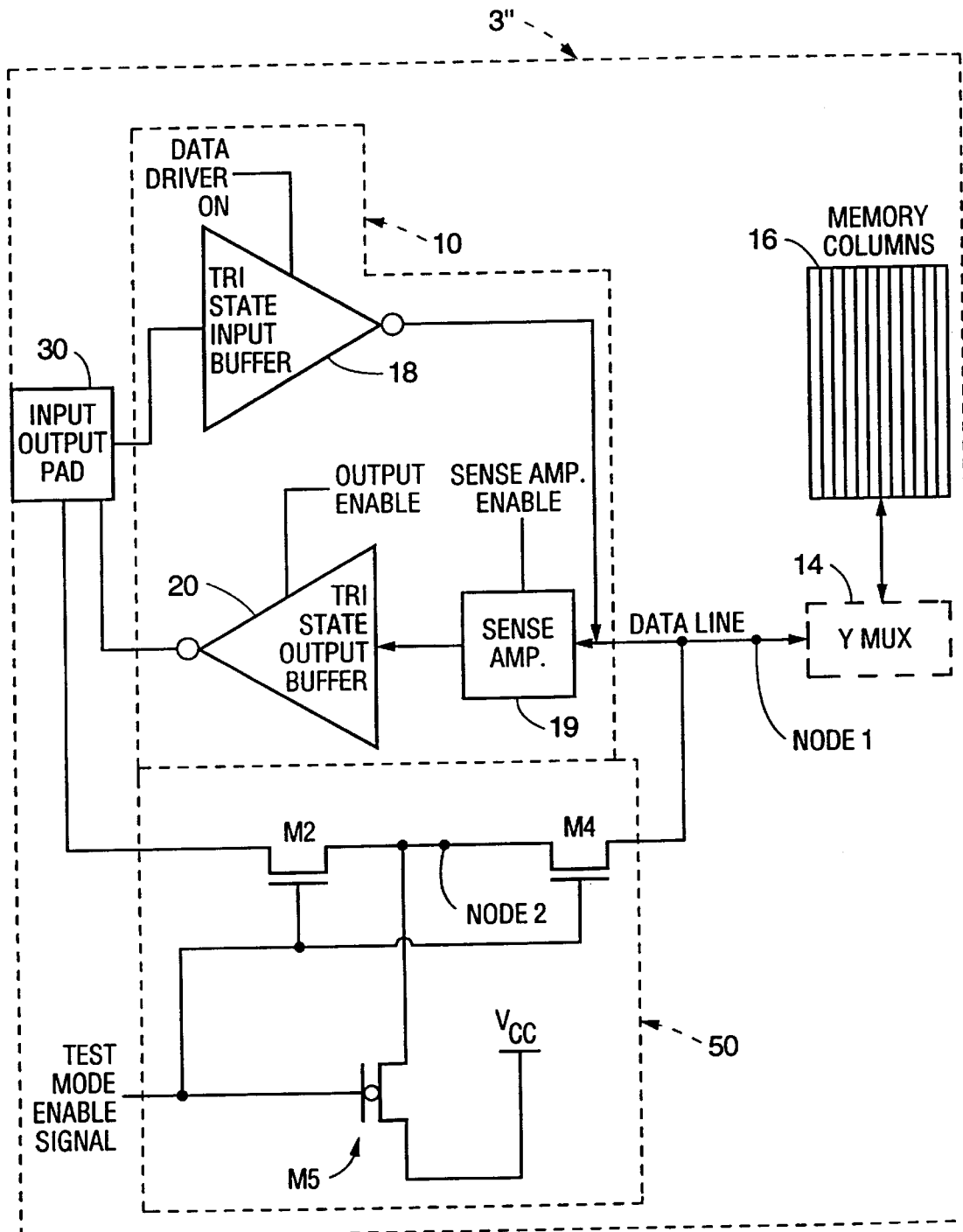
FIG. 5 is a schematic diagram of a variation on FIG. 3 in which a second embodiment of a test mode switch according to the present invention is provided as a substitute for conventional test mode switch M1 of FIG. 3.

We next describe a second embodiment of the invention with reference to FIG. 5. This embodiment is a memory chip which includes test mode switch 50 (comprising NMOS transistors M2 and M4 and PMOS transistor MS) which embodies the present invention as a substitute for conventional test mode switch M1 of FIG. 3. It is contemplated that in preferred implementations of the FIG. 5 chip, each cell in the memory array is a nonvolatile memory cell (preferably a flash memory cell).

Memory chip 3," of FIG. 5 is identical to conventional memory chip 3 of FIG. 1 except in that chip 3" includes test mode switch 50 rather than conventional test mode switch M1. Only test mode switch 50 of chip 3" will be described below, since the foregoing description of those elements of chip 3 other than test mode switch M1 applies equally well to chip 3".

With reference to FIG. 5, test mode switch 50 has the following structure. The gate of PMOS transistor MS receives control signal "Test Mode Enable" from internal control logic of the chip. The source of MS is connected to supply voltage $V_{CC}$, and the drain of M5 is connected to Node 2. NMOS transistors M2 and M4 are both connected as pass transistors, with the gate of each receiving control signal Test Mode Enable. The source and drain terminals of each of M2 and M4 will be referred to collectively as "channel" terminals. One channel terminal of M2 is connected to one channel terminal of M4 (at Node 2), the other channel terminal of M2 is connected to I/O pad 30, and the other channel terminal of M4 is connected to Node 1. Node 1 is connected through multiplexer circuit 14 to the selected memory cell.

Test mode switch 50 operates as follows in response to control signal Test Mode Enable:

when Test Mode Enable is high (when the value of Test Mode Enable triggers the "test" mode of FIG. 5), M2 and M4 are "on" and MS is "off." Thus, M2 and M4 function as pass transistors which pass a signal (a "test" signal) indicative of test data to be written to or read from a selected cell of array 16 (e.g., a current signal indicative of test data read from the selected cell). The test signal passes through the channel terminals of M2 and M4 (and thus between I/O pad 30 and the selected cell of array 16) without passing through buffer 10; and when Test Mode Enable is low (when the value of Test Mode Enable triggers the "normal" operating mode of FIG. 5), M2 and M4 are "off" and M5 is "on." Thus, signals (indicative of data to be written to memory array 16) provided from an external device to I/O pad 30 are buffered in input buffer 18 and then asserted to memory array 16, or signals (indicative of data read from memory array 16) are asserted from memory array 16 to sense amplifier 19, amplified in amplifier circuit 19, and then buffered in output buffer 20 and asserted to I/O pad 30. Typically, the "low" value of Test Mode Enable is ground potential.

When the FIG. 5 circuit executes a write operation during the normal operating mode of FIG. 5, with Test Mode Enable "low" (grounded), M5 "on," and M2 and M4 "off" (i.e., with the gates of M2 and M4 grounded), if the voltage on I/O pad 30 falls sufficiently low (e.g., to –1 volt, where both M2 and M4 have a threshold voltage $V_{th}$ approximately equal to 0.5 volt), M2 can turn "on." However, even if M2 turns "on" under this condition the voltage at Node 1 will not be affected thereby, as will be understood by considering the following explanation.

In the described circumstances, Node 2 is held at a voltage substantially equal to $V_{CC}$ through transistor M5. If I/O pad 30 is brought down to –1 volt externally, M2 will tend to turn on. Once that happens, both transistors M5 and M2 are on and there is a current path between $V_{CC}$ and I/O pad 30. M5 will try to pull I/O pad 30 up to the point where M2 turns off (e.g., –0.5 volt in this example) and I/O pad 30 will try to pull down Node 2 to –1 volt. The voltage level of Node 2 will be somewhere between $V_{CC}$ and –1 volt, at a specific value determined by the relative current driving strengths of M2 and M5. If M5's current driving capability is larger than M2's, then Node 2 will end up closer to $V_{CC}$ than to –1 volt. If M2's current driving capability is larger than M5's, then Node 2 will end up closer to –1 volt than to $V_{CC}$.

The strength of each of the two transistors M2 and M5 is proportional to its width/length ratio (W/L) and the value of $(V_{GS}-V_T)^2$ applied to it. Transistor M2 needs to be sized to have sufficient strength for transferring the applied voltage and current when the test mode enable signal is active. However, during the normal operating mode, if I/O pad 30 goes to –1 volt, the $(V_{GS}-V_T)$ of M2 is very small and $(V_{GS}-V_T)^2$ is even smaller. On the other hand, the gate of M5 is grounded, and as Node 2 is pulled down through M2, $V_{GS}$ of M5 will stay fixed at about five volts. Although it is conceivable that sizes for M2 and M5 could be chosen which would cause switch 50 to operate with low efficiency, one would need to try very hard in order to determine such sizes. This is true because the only circumstance under which switch 50 would not work properly is for Node 2 to be pulled down so low that M4 also turns on (assuming M2 has turned on). Since the gate of M4 is at ground (0 volts), Node 2 would need to come down to $V_T$ below ground (e.g., –0.5 volts in the example) for that to occur. As described previously, for this to happen, $(V_{GS}-V_T)^2$ of M2 is 0.25 and $(V_{GS}-V_T)$ of M5 is about 20. So, unless the W/L of M2 is on the order of 100 times greater than the W/L of M5, this situation would not occur since the current $I_D$ of each of M2 and M5 is proportional to (W/L) $(V_{GS}-V_T)^2$. Therefore, as mentioned previously, it would be necessary to skew the sizes of M2 and M5 radically in order to design a specific implementation of switch 50 that would not function properly.

With a properly functioning implementation of switch 50, in the normal operation mode, even if M2 turns on, it would not be able to pull Node 2 down sufficiently to turn M4 on. Thus, Node 1 will remain undisturbed by a voltage at I/O pad 30 which causes M2 to turn on.

In this way, circuit 50 prevents an incorrect data value from being written from input buffer 18 to the selected memory cell even if M2 undesirably turns on in response to a low voltage on I/O pad 30 during a write operation in the normal operating mode.

Circuit 50 also prevents an incorrect data value from being read from a selected memory cell even if M2 undesirably turns on in response to a sufficiently low voltage on I/O pad 30 during a read operation in the normal operating mode. The explanation for this is as follows. When circuit 3" reads a programmed bit from a selected memory cell, the bitline of the selected column of cells (and thus Node 1) goes to a voltage higher than sense amplifier 19's trip point, with the result that the output voltage at I/O pad 30 (the data value read from the selected cell) goes from high to low. I/O pad 30 might go to a negative voltage due to inductive coupling. For the reason explained above, switch 50 will not allow Node 2 to go sufficiently low to turn M4 on even if M2 is turned on. This decouples Node 1 from pad 30, and hence the noise is not fed back from pad 30 to Node 1 during a read operation. Thus, the output voltage provided from output buffer 20 to I/O pad 30 remains unaffected by the transition of M2 from off to on (since M4 remains off).

The FIG. 4 embodiment of the invention is preferable to that of FIG. 5 for some applications, since PMOS transistor M5 of FIG. 5 may be subject to a non-negligible latchup effect under some conditions (since M5 will be formed in a well of N-type semiconductor material in a substrate of P-type semiconductor material). In contrast, NMOS transistor M3 of FIG. 4 will typically not be subject to a latchup problem under the same conditions.

Preferred embodiments of the invention have been described with reference to FIGS. 4 and 5. Although these embodiments have been described in some detail, it is contemplated that changes from any of these embodiments can be made without departing from the spirit and scope of the invention as defined by the appended claims.

What is claimed is:

1. A non-volatile memory device, comprising:

an input/output data communication connection for communicating data between the non-volatile memory device and an external device;

an array of non-volatile memory cells for storing data;

buffer circuitry coupled to the array and the input/output data communication connection for buffering input and output data during normal memory device operation; and bypass circuitry coupled to the array and the input/output data communication connection having a first mode for bypassing the buffer circuitry during memory device test mode operation, such that a conductive path is provided around the buffer circuitry during the memory device test mode operation, and having a second mode wherein the conductive path is interrupted during normal memory device operation, wherein the bypass circuitry comprises:

a plurality of isolation transistors having a common node and connected in series between the input/output data communication connection and the array for bypassing the buffer circuitry during memory device test mode operation; and a pull-up transistor connected to the common node for coupling the common node to a high voltage during normal memory device operation such that a low voltage provided on the input/output data communication connection cannot activate the plurality of isolation transistors.

2. The non-volatile memory device of claim 1, wherein the buffer circuitry comprises:

an input buffer connected between the input/output data communication connection and the array; and an output buffer circuit connected between the array and the input/output data communication connection.

3. The non-volatile memory device of claim 2, wherein the output buffer circuit comprises:

a sense amplifier circuit coupled to the array; and an output buffer connected between the sense amplifier circuit and the input/output data communication connection.

4. A non-volatile memory device, comprising:

an input/output data communication connection for communicating data between the non-volatile memory device and an external device;

an array of non-volatile memory cells for storing data;

buffer circuitry coupled between the array and the input/output data communication connection; and bypass circuitry coupled between the array and the input/output data communication connection having a first mode for bypassing the buffer circuitry and having a second mode for normal memory device operation.

5. The non-volatile memory device of claim 4, wherein the bypass circuitry comprises:

a plurality of isolation transistors having a common node and connected in series between the input/output data communication connection and the array for bypassing the buffer circuitry during memory device test mode operation; and a pull-up transistor connected to the common node for coupling the common node to a high voltage during normal memory device operation such that a low voltage provided on the input/output data communication connection cannot activate the plurality of isolation transistors.

6. The non-volatile memory device of claim 4, wherein the bypass circuitry comprises:

a first pass transistor and a second pass transistor connected in series, wherein a channel terminal of the first pass transistor and a channel terminal of the second pass transistor are each connected to a node; and an isolation circuit coupled between the input/output pad connection and the node, the isolation circuit configured to maintain the node at a fixed supply voltage during the normal operating mode.

7. The integrated circuit of claim 6, wherein the isolation circuit comprises:

an inverter connected to receive a test mode enable signal and to output an inverted test mode enable signal; and an NMOS transistor having a gate connection to the inverter output to receive the inverted test mode enable signal, and having its source connected to the node, and having its drain connected to the fixed supply voltage.

8. The integrated circuit of claim 6, wherein the isolation circuit comprises:

a PMOS transistor having a gate connection to a test mode enable signal, and having its source connected to the node, and having its drain connected to the fixed supply voltage.

9. A non-volatile memory device comprising:

an input/output data port communicating data between the non-volatile memory device and an external device;

an array of non-volatile memory cells for storing data;

buffer circuitry coupled to the array and the input/output data communication connection for buffering input and output data during normal memory device operation;

bypass circuitry connected between the array and the input/output for performing the function of bypassing the buffer circuitry during memory device test mode operation, such that a conductive path is provided around the buffer circuitry during memory device test mode operation, and interrupting the conductive path during normal memory device operation, wherein the conductive path is interrupted during normal memory device operation irrespective of a voltage on the input/output data communication connection.

10. An integrated circuit, comprising:

an input/output pad connection for communicating data between the integrated circuit and an external device;

a buffer circuit connected between the input/output pad connection and an external memory array for buffering input and output during a normal integrated circuit operating mode; and a bypass circuit coupled between the input/output connection pad and the external memory array, the bypass circuit connecting the input/output pad connection directly to the external memory array in the test mode, the bypass circuit comprising:

a first pass transistor and a second pass transistor connected in series, wherein a channel terminal of the first pass transistor and a channel terminal of the second pass transistor are each connected to a node; and an isolation circuit coupled between the input/output pad connection and the node, the isolation circuit configured to maintain the node at a fixed supply voltage during the normal operating mode.

11. The integrated circuit of claim 10, wherein the isolation circuit comprises:

an inverter connected to receive a test mode enable signal and to output an inverted test mode enable signal; and an NMOS transistor having a gate connection to the inverter output to receive the inverted test mode enable signal, and having its source connected to the node, and having its drain connected to the fixed supply voltage.

12. The integrated circuit of claim 10, wherein the isolation circuit comprises:

a PMOS transistor having a gate connection to a test mode enable signal, and having its source connected to the node, and having its drain connected to the fixed supply voltage.

13. The integrated circuit of claim 10, wherein the buffer circuit comprises:

an input buffer connected between the input/output data communication connection and the array; and an output buffer circuit connected between the array and the input/output data communication connection.

14. The integrated circuit of claim 13, wherein the output buffer circuit comprises:

a sense amplifier circuit coupled to the array; and an output buffer connected between the sense amplifier circuit and the input/output data communication connection.

15. An integrated circuit, comprising:

an input/output pad connection for communicating data between the integrated circuit and an external device;

a buffer circuit connected between the input/output pad connection and an external memory array for buffering input and output during a normal integrated circuit operating mode; and a bypass circuit coupled between the input/output connection pad and the external memory array, the bypass circuit connecting the input/output pad connection directly to the external memory array in the test mode, the bypass circuit comprising:

a plurality of isolation transistors having a common node and connected in series between the input/output pad connection and the array for bypassing the buffer circuitry during memory device test mode operation; and a pull-up transistor connected to the common node for coupling the common node to a high voltage during normal memory device operation such that a low voltage provided on the input/output pad connection cannot activate the plurality of isolation transistors.

16. The integrated circuit of claim 15, wherein the buffer circuit comprises:

an input buffer connected between the input/output data communication connection and the array; and an output buffer circuit connected between the array and the input/output data communication connection.

17. The integrated circuit of claim 16, wherein the output buffer circuit comprises:

a sense amplifier circuit coupled to the array; and an output buffer connected between the sense amplifier circuit and the input/output data communication connection.

18. An integrated circuit, comprising:

an input/output pad connection for communicating data between the integrated circuit and an external device;

a buffer circuit connected between the input/output pad connection and an external memory array for buffering input and output during a normal integrated circuit operating mode; and a bypass circuit coupled between the input/output connection pad and the external memory array, the bypass circuit connecting the input/output pad connection directly to the external memory array in the test mode, the bypass circuit comprising:

a first pass transistor and a second pass transistor connected in series, wherein a channel terminal of the first pass transistor and a channel terminal of the second pass transistor are each connected to a node; and an isolation circuit coupled between the input/output pad connection and the node, the isolation circuit configured to maintain the node at a fixed supply voltage during the normal operating mode.

* * * * *

UNITED STATES PATENT AND TRADEMARK OFFICE
CERTIFICATE OF CORRECTION

PATENT NO. : 6,094,377
DATED : July 25, 2000
INVENTOR(S) : Roohparvar et al.

It is certified that error appears in the above-identified patent and that said Letters Patent is hereby corrected as shown below:

Column 9,
Line 26, delete "Chip 3," and insert -- Chip 3 --, therefor.
Line 34, delete "transistor MS" and insert -- transistor M5 --, therefor.
Line 36, delete "source of MS" and insert -- source of M5 --, therefor.
Line 53, delete "MS is "off."" and insert -- M5 is "off". --, therefor.

Signed and Sealed this

Twelfth Day of October, 2004

JON W. DUDAS
*Director of the United States Patent and Trademark Office*